(12) United States Patent
Sidhu et al.

(10) Patent No.: US 7,135,951 B1
(45) Date of Patent: Nov. 14, 2006

(54) INTEGRATED CIRCUIT INDUCTORS

(75) Inventors: Lakhbeer S. Sidhu, San Jose, CA (US); Irfan Rahim, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 55 days.

(21) Appl. No.: 10/620,859

(22) Filed: Jul. 15, 2003

(51) Int. Cl.
*H01F 5/00* (2006.01)
*H01F 7/06* (2006.01)

(52) U.S. Cl. ............... 336/200; 336/232; 336/223; 29/602.1; 29/605

(58) Field of Classification Search ............... 336/223, 336/200, 232; 257/E21.001, E21.022, E27.046, 257/E21.016; 29/602.1, 605, 606
See application file for complete search history.

(56) References Cited

U.S. PATENT DOCUMENTS

| | | | |
|---|---|---|---|
| 4,081,896 A * | 4/1978 | Dingwall | 438/233 |
| 5,239,289 A * | 8/1993 | Ferraiolo et al. | 336/180 |
| 5,446,311 A | 8/1995 | Ewen et al. | |
| 5,515,022 A * | 5/1996 | Tashiro et al. | 336/200 |
| 6,287,931 B1 | 9/2001 | Chen | |
| 6,362,012 B1 | 3/2002 | Chi et al. | |
| 6,429,763 B1 * | 8/2002 | Patel et al. | 336/200 |
| 6,528,835 B1 * | 3/2003 | Kaeriyama | 257/296 |
| 6,611,188 B1 | 8/2003 | Yeo et al. | |
| 6,636,441 B1 * | 10/2003 | Taura | 365/185.28 |
| 6,650,220 B1 * | 11/2003 | Sia et al. | 336/200 |
| 6,798,039 B1 * | 9/2004 | Gillespie et al. | 257/531 |
| 2002/0158306 A1 * | 10/2002 | Niitsu | 257/531 |
| 2002/0177322 A1 * | 11/2002 | Li et al. | 438/710 |
| 2003/0234436 A1 * | 12/2003 | Hsu et al. | 257/531 |

OTHER PUBLICATIONS

Xiao Huo, "Silicon-based High-O Inductors Incorporating Electroplated Copper and Low-K BCB Dielectric" IEEE Electron Device Lett. vol. 23, No. 9, Sep. 2002; pp. 520-522.

* cited by examiner

*Primary Examiner*—Anh Mai
(74) *Attorney, Agent, or Firm*—G. Victor Treyz

(57) ABSTRACT

Integrated circuit inductors may be formed using a spiral layout on the surface of an interconnect dielectric stack. Conductive lines from two or more metal layers in the interconnect stack may be electrically connected using one or more via trenches. The via trench interconnection arrangement reduces the resistance of the inductor and increases the inductor's Q-factor. The Q-factor of the inductor may also be increased by placing a region of n-type and p-type wells or a metal plate region beneath the inductor to reduce power losses during operation. Shallow trench isolation may be used to reduce eddy currents and increase Q. The effects of copper dishing and trench blow-out may be used during inductor fabrication. A dual damascene fabrication process may be used.

26 Claims, 15 Drawing Sheets

INTEGRATED CIRCUIT INDUCTORS

BACKGROUND OF THE INVENTION

This invention relates to inductors, and more particularly, to inductors formed on integrated circuits.

Integrated circuits are used in a variety of electronic equipment. It is often necessary to use inductors with such circuits. For example, the circuitry used for radio-frequency (RF) applications, microwave applications, and many analog circuit applications can require inductors.

Although it is sometimes possible to make use of discrete inductors, inductors that are formed on the integrated circuit itself are often preferred or required for performance and economic reasons. Fabricating an inductor as part of an integrated circuit structure eliminates the need for special packaging and can enhance reliability. Integrated circuit inductors are typically spiral in shape and are formed on the top surface of the circuit.

An important figure of merit for an integrated circuit inductor is its quality factor Q. The quality factor Q for an inductor is the ratio of the energy stored in the inductor to the energy dissipated by the inductor. Inductors with low Q values are inefficient and can degrade circuit performance.

The value of Q is affected by the resistance of the conductive lines used to form the inductor. Conductors with relatively higher resistance produce inductors with poor Q values. As a result, various approaches have been made to reduce the resistance of the lines.

With one approach, an upper-layer aluminum line is connected to a lower-layer aluminum line by tungsten vias. The lower-layer aluminum line serves as a parallel current path that can help to reduce the resistance of the upper-layer aluminum line. However, tungsten is not highly conductive and the connections between the upper-layer aluminum line and lower-layer aluminum line are only made at a finite number of locations, so the resistance of the inductor lines formed in this way can still be higher than desired.

Another approach for reducing the resistance of the lines involves adding additional thickness to the lines. However, many integrated circuit processes do not allow thick metal lines to be formed. Although lines can sometimes be thickened using special post-processing procedures, the resulting increase in process complexity can have an adverse impact on cost and reliability.

It might be desirable to reduce the resistance of the conductive lines by increasing the width of the conductive lines. However, with a normal semiconductor fabrication process there is generally a maximum line width allowed by the process design rules. Moreover, regardless of the process that is used, the line width cannot be too large, because this can lead to capacitive coupling with the silicon substrate, which reduces Q.

It is therefore an object of the present invention to provide integrated circuit inductors with improved Q values.

SUMMARY OF THE INVENTION

Integrated circuit inductors are provided that have high Q-factors. An integrated circuit may have analog circuitry, radio-frequency (RF) circuitry, microwave circuitry, or other circuitry that uses such inductors during operation of the circuit.

An integrated circuit inductor may be based on a conductive inductor line that forms a spiral on the surface of the integrated circuit. The Q-factor of the integrated circuit may be enhanced by reducing the resistance of the conductive inductor line and by reducing undesirable power losses due to electromagnetic interactions between the inductor and the underlying semiconductor substrate of the integrated circuit.

Inductor resistance may be reduced by using high-conductivity metals such as copper in the inductor line. Resistance may be further reduced by using relatively wide metal lines that satisfy the design rules for the semiconductor fabrication process used during fabrication of the integrated circuit.

The inductor resistance may also be reduced by electrically connecting two or more conductive lines, each of which is contained in a different respective metal layer in the interconnect dielectric stack of the integrated circuit. With one suitable approach, the conductive lines may be interconnected using via trenches. A conductive line that lies within one metal layer of the interconnect stack may be vertically aligned with a conductive line in another metal layer. One or more via trenches may be formed in a via metal layer between the two respective metal layers. The via trenches run parallel to the conductive lines, so that the via trenches form a continuous low-resistance electrical path between the conductive lines and act as supplemental conductive lines themselves.

A damascene fabrication process may be used to form each conductive line. The via trenches and the conductive lines may be formed together using a dual-damascene process.

During fabrication, the conductive lines may be subject to chemical mechanical planarization (CMP) processing steps. For example, during a copper dual-damascene process, the metal layers are subjected to CMP processing steps to planarize the layers of the interconnect stack and to remove excess copper. During this process, the relative softness of the copper metal lines relative to surrounding dielectric material in the interconnect stack causes the upper surfaces of the lines to form concave surfaces. This effect is known as copper dishing. By placing a parallel vertically-aligned additional conductive line beneath a given conductor, the lower surface of the given conductor becomes convex, thereby reducing the resistance of the given conductor.

The resistance of the conductive lines in the inductor may also be reduced by forming multiple via trenches in parallel. Due to the trench blow-out effect, the bottoms of the trenches may be distinct while the tops of the trenches merge together to form a solid conductor. The solid conductor region of the merged trenches exhibits low resistance, which helps to reduce the overall resistance of the conductive inductor line formed using the conductive lines in the metal layers and the via trenches. The use of multiple individual parallel via trenches is preferred because this makes the via trench fabrication step compatible with generally-applicable semiconductor fabrication design rules. These design rules generally prohibit the formation of grooves in the via trench layer that are as wide as the widths desired for the conductive lines in the metal layers (which may be, for example, 5 microns in width). In many standard integrated circuit designs, via trenches are already used in forming die seal trenches around the periphery of a given chip, so producing via trenches for the inductor structures may be compatible with existing via trench formation process steps.

Lowering the resistance of the conductive lines and via trenches in the conductive inductor line helps to lower power dissipation in the conductive inductor line due to ohmic losses. This tends to improve the quality factor Q of the integrated circuit inductor.

Power losses may also result from electromagnetic interactions between the integrated circuit inductor and the underlying integrated circuit substrate. Such interactions may be reduced by forming the integrated circuit inductor at the surface of the integrated circuit dielectric stack. For example, if the interconnect dielectric stack has nine layers of metal, the integrated circuit inductor may be formed using metal layer 9 (M9) and, if desired, adjacent metal layers such as M8 and M7. Because the M9 layer is the metal layer that lies the farthest from the semiconductor substrate of the integrated circuit, the electromagnetic field interactions between the inductor and the substrate are reduced the most when metal layers such as the M9 layer are used.

The metal of the inductor may be placed at an effectively greater distance from the semiconductor substrate by forming a layer of shallow trench isolation beneath the inductor (e.g., in a roughly square area of comparable size to the inductor). Integrated circuits typically have shallow trench isolation to isolate transistors and other semiconductor devices on the circuit from each other. By placing a region of this same shallow trench isolation beneath the inductor, a thin region of semiconductor at the substrate surface is replaced by an insulator. Because no eddy currents can flow within the insulating region of shallow trench isolation, substrate power losses are reduced.

Additional isolation of the inductor may be achieved by placing a metal plate under the inductor. The metal plate may, for example, be formed using the first layer of metal (e.g., M1). By forming an inductor-sized region of metal M1 beneath the inductor, electromagnetic field penetration into the semiconductor surface and corresponding substrate power losses can be reduced.

If desired, a region of alternating n-type and p-type wells may be formed beneath the inductor. The n-wells and p-wells may be biased to form reverse-biased diodes, which block eddy current flow in the substrate. The n-type and p-type wells may be formed during the normal implantation processes used for device fabrication on the integrated circuit. In integrated circuits in which deep implants (e.g., deep n-wells or deep p-wells) are formed, these deep implants may be used in the region of patterned n-type and p-type isolation wells beneath the inductor to further block eddy current flow. With one suitable arrangement, the n-type and p-type wells form a checkerboard pattern. With another suitable arrangement, the n-type and p-type wells form alternating narrow stripes (e.g., stripes which are each about 5 microns wide, 3–7 microns wide, or as wide as permitted by the design rule in place in the integrated circuit fabrication process).

Using these arrangements, the Q-factor of the inductor may be improved without disrupting the normal process steps used during fabrication of the integrated circuit. For example, these arrangements may be used to form high-quality-factor inductors without the use of extensive post-processing steps to build up the inductor conductors or the use of feature sizes that would violate the normal design rules of the semiconductor fabrication process.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
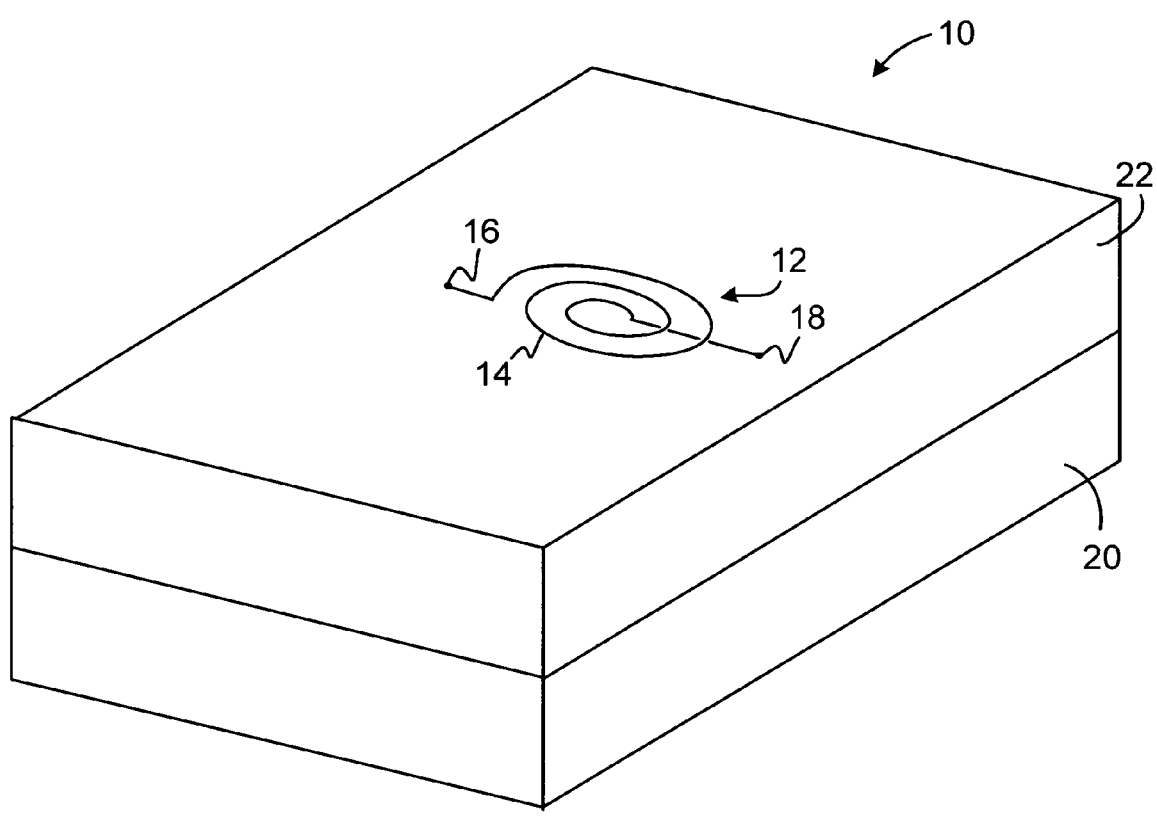
FIG. 1 is a perspective view of an illustrative integrated circuit inductor in accordance with the present invention.

An illustrative integrated circuit 10 having an integral integrated circuit inductor 12 is shown in FIG. 1. Inductor 12 is formed by coiling a conductive line 14 so that magnetic flux is channeled through its center. During operation of inductor 12, alternating current (AC) signals are applied to conductive inductor line 14 using terminal 16 and terminal 18.

The integrated circuit 10 may be formed from a semiconductor substrate 20 in which transistors and other semiconductor devices are formed. During operation of integrated circuit 10, these devices interact with inductor 12 through conductive lines connected to terminal 16 and terminal 18. Because inductor 12 is formed on the same integrated circuit structure as the transistors and other devices, it is not necessary to connect inductor 12 to the circuitry of circuit 10 through a special package or external wires. This can improve the performance of circuit 10, while reducing cost and increasing reliability.

The substrate material from which substrate 20 is formed may be a semiconductor such as silicon (or silicon-on-insulator), silicon-germanium, gallium arsenide, indium phosphide, combinations of such materials, etc. These substrate materials are typically processed while in the form of wafers that are subsequently divided into individual circuits 10 prior to packaging.

The circuitry of integrated circuit 10 is interconnected by a number of layers of circuit interconnections 22. These interconnect layers include patterned conductors and insulators. The conductors of the regular metal interconnects on circuit 10 serve to route signals between various devices on circuit 10 such as transistors. The insulators serve to electrically isolate the conductors from each other and from the devices formed in the substrate. The layers of insulators and conductors in the interconnects may be formed using plasma deposition and etching, chemical vapor deposition, sputtering and evaporation, electroplating, and other suitable semiconductor fabrication techniques.

In a typical modern integrated circuit there are about 4–9 layers of metal conductors separated by a corresponding number of layers of inter-layer dielectric insulator material. Special-purpose integrated circuits may have fewer layers of metal and integrated circuits based on more advanced processes may use more layers of metal. In general, the number of layers of metal that are used to form interconnects 22 depends on the type of integrated circuit being formed. Accordingly, in many of the FIGS. only a few of the particular layers of conductor and insulator are shown in detail, while the rest are depicted more generally as interconnects 22 (also referred to as layers 22, dielectric stack 22, etc.).

The quality factor Q is a figure of merit for an inductor given by the ratio of the energy stored in the inductor to the energy dissipated by the inductor. For optimum circuit performance, it is desirable to have a Q that is as large as possible.

Figure 2:
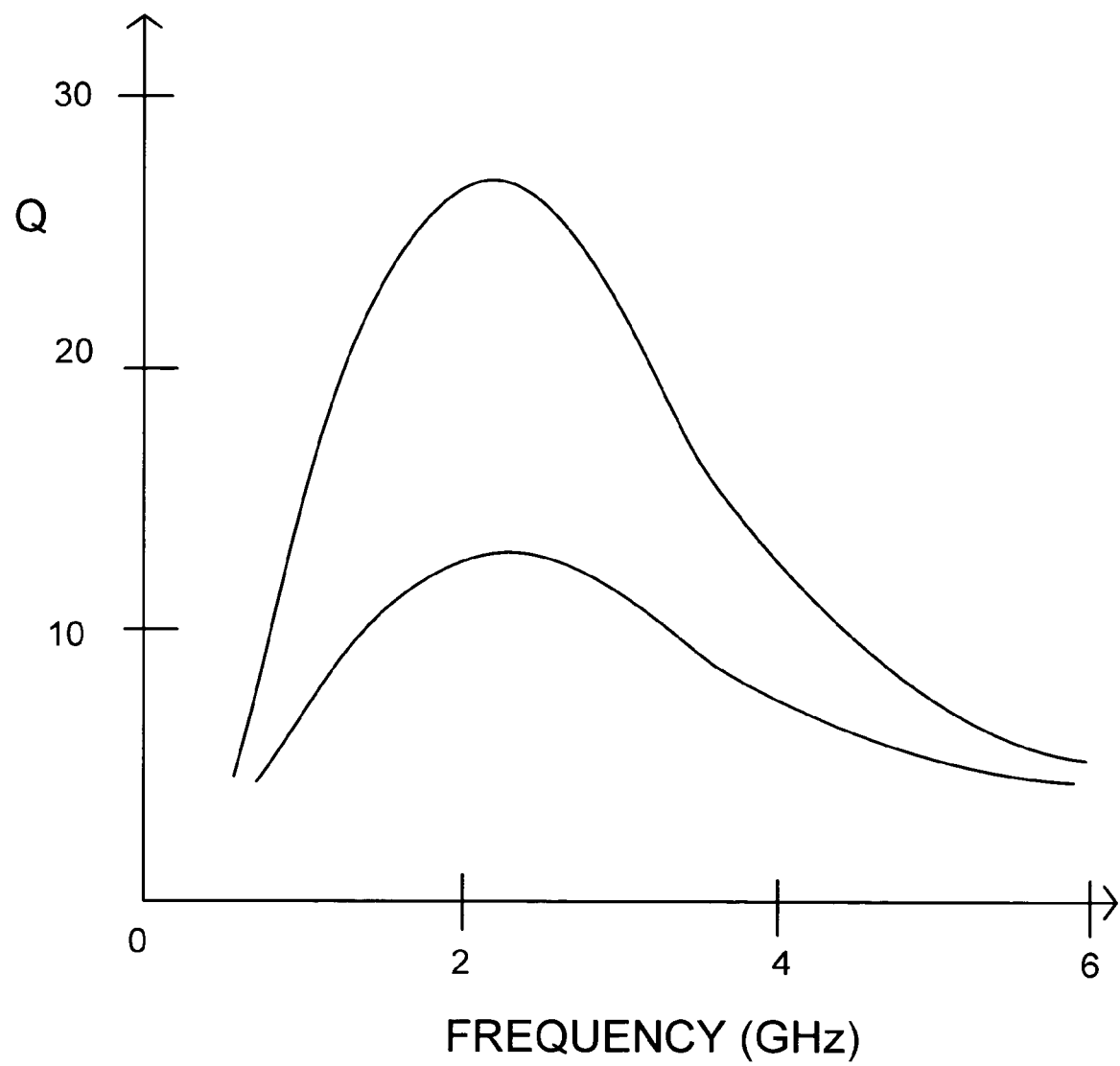
FIG. 2 is a graph illustrating how line resistance and substrate energy dissipation affect Q in an integrated circuit inductor.

As shown in the graph of FIG. 2, Q is a function of the frequency of the AC signals applied to inductor 12 at terminals 16 and 18. In the example of FIG. 2, the inductor has been designed for optimum performance at about 2 GHz. The upper trace in FIG. 2 represents the performance expected of an illustrative high-quality inductor. The lower trace corresponds to a sub-optimal inductor that has a lower Q than the upper-trace inductor at all operating frequencies.

At a given frequency, the Q-factor of an integrated circuit inductor is influenced by the resistance of the conductive line 14 and the amount of energy dissipated in the substrate 20 due to electromagnetic interactions between the inductor 12 and the substrate 20. When the conductive line 14 used for the inductor has a high resistance, more power is dissipated in the line 14 due to ohmic losses, which leads to reduced Q. Electromagnetic effects can reduce Q by causing eddy currents in substrate 20 that lead to additional ohmic losses.

Figure 3:
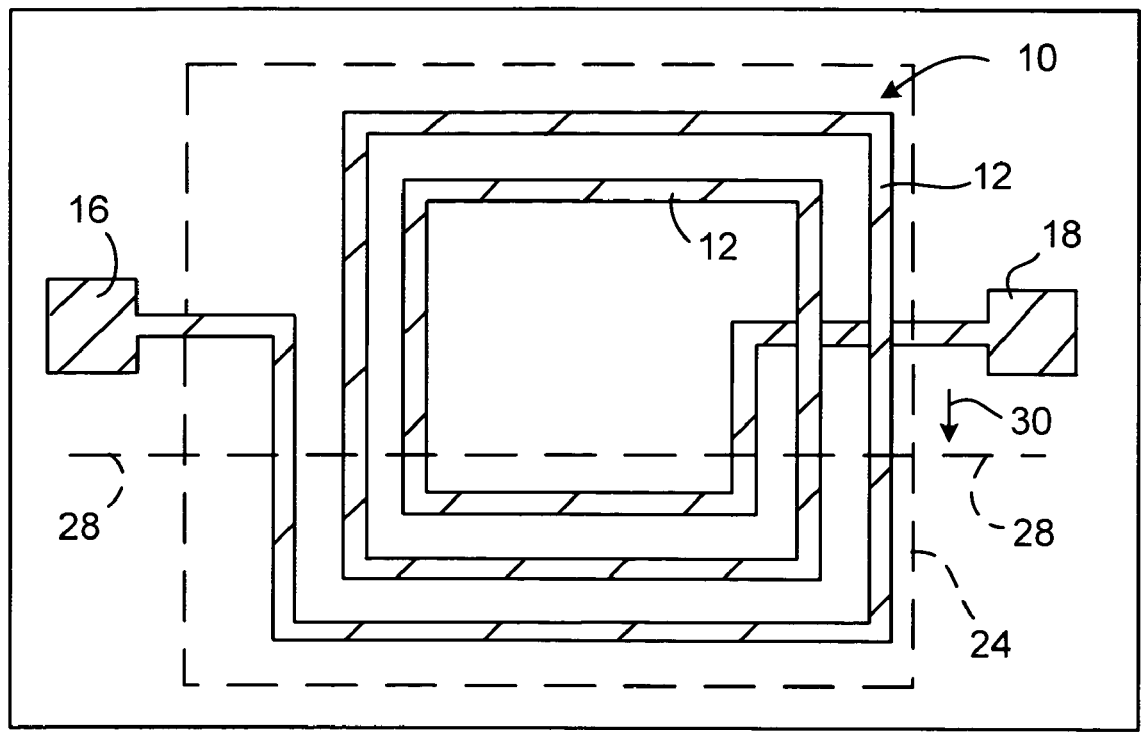
FIG. 3 is a top view of an illustrative inductor in accordance with the present invention.

One way in which to improve Q is to reduce the eddy currents in substrate 20. A top view of an illustrative inductor 10 is shown in FIG. 3. As shown in FIG. 3, inductor 10 may be formed from a conductive line 14 that has a spiral pattern. The spiral may be square or rectangular to simplify processing with standard lithographic masks or may have other suitable shapes such as a triangular shape, a polygonal shape, a smoothly curving shape, etc. The line 14 is preferably formed using at least the top layer of metal in interconnections 22, because this places the inductor's conductors as far away from the substrate 20 as possible, thereby reducing possible electromagnetic interactions between the inductor and the substrate. As an example, the line 14 may be formed (at least partially) using the top metal layer (e.g., metal layer nine in a nine-layer process).

The lateral dimensions of the inductor may be (as an example) 50 microns, 100 microns, 200 microns, 20–200 microns, 50–400 microns, or any other suitable size. The width of the lines 14 may be, for example, 5 microns, 2–10 microns, or any other suitable width. The width of lines 14 is preferably within the tolerances specified by standard integrated circuit fabrication process design rules, so that inductor 12 can be formed at the same time that the top metal layer in circuit 10 is being used to form part of the interconnections 22.

The inductor arrangement shown in FIG. 3 has pads for terminals 16 and 18, but this is merely illustrative. If desired, the conductive inductor line 14 may be interconnected with the circuitry of integrated circuit 10 using terminals or interconnects of any suitable shape. The portion of the line 14 that is shown as traversing under the other portions of line 14 in FIG. 1 may be formed using one or more lower metal layers (e.g., metal layer 8).

As inductor 10 is operated, AC signals are applied between terminals 16 and 18, which causes alternating electromagnetic fields to penetrate into the portion of the substrate 20 underlying the inductor. These fields can cause carriers in the substrate to move, producing eddy currents.

The eddy currents in turn give rise to ohmic heating in substrate 20. This can be a significant source of power dissipation in inductor 10.

If desired, eddy currents can be reduced by placing a pattern of n-type and p-type wells under the inductor. In the illustrative arrangement of FIG. 3 in which the inductor 10 has a square-spiral shape, the n and p wells may be formed within a square region bounded by dotted line 24. (A larger region 24 could be used if enough real estate is available on the circuit.)

The n-type and p-type wells may be biased so that they form multiple reverse-biased diodes. The diodes interrupt the lateral flow of current within the substrate at the boundaries between the n and p wells.

Figure 4:
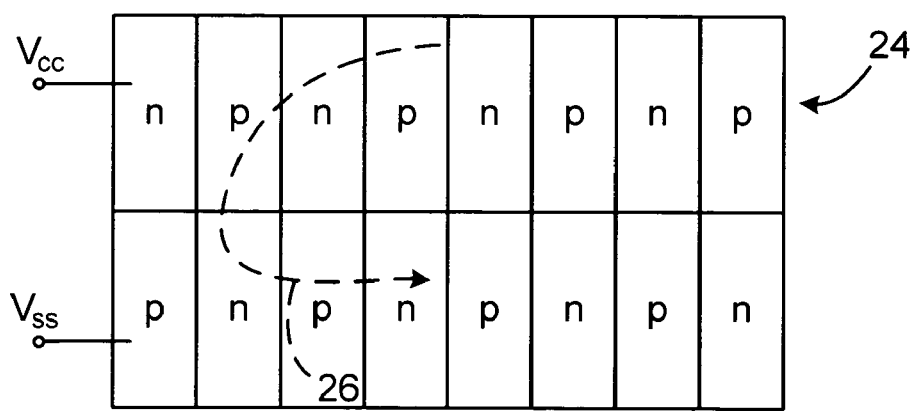
FIG. 4 is a top view of an illustrative substrate doping pattern that may be used to inhibit substrate energy dissipation due to eddy currents in accordance with the present invention.

An illustrative rectangular-checker-board pattern of n and p wells that may be used in region 24 is shown in FIG. 4. As shown in FIG. 4, each n-type well may be biased using a positive voltage such as Vcc, whereas each p-type well may be biased using a source of ground potential such as Vss. If desired, other suitable voltages may be used to bias the n and p regions under the inductor to produce the reverse-biased diodes.

The dotted line 26 in FIG. 4 shows a possible eddy current path. Because the boundary between each n and p well in region 24 prevents current from flowing, eddy currents cannot build up along path 26. The n and p wells of region 24 therefore help to reduce power dissipation in the substrate 20, which improves Q.

The n-type regions and p-type regions underlying the illustrative inductor of FIGS. 3 and 4 use an array-type pattern having two rows and eight columns. Other patterns may be used. For example, the region 24 may be made of a square checkerboard or may be made of a one-row pattern of alternating n and p stripes. If desired, the stripes may be narrow. For example, each n well and each p well may have a height as long as the inductor diameter (e.g., 100 microns) and may have a substantially smaller width (e.g., 1–20 microns or as small as permitted by the design rules for the semiconductor fabrication process used to form circuit 10). These are merely illustrative patterns of n and p wells that may be used to form eddy-current-blocking reverse-biased-diode boundaries under the inductor 10. Any suitable pattern may be used if desired.

Figure 5:
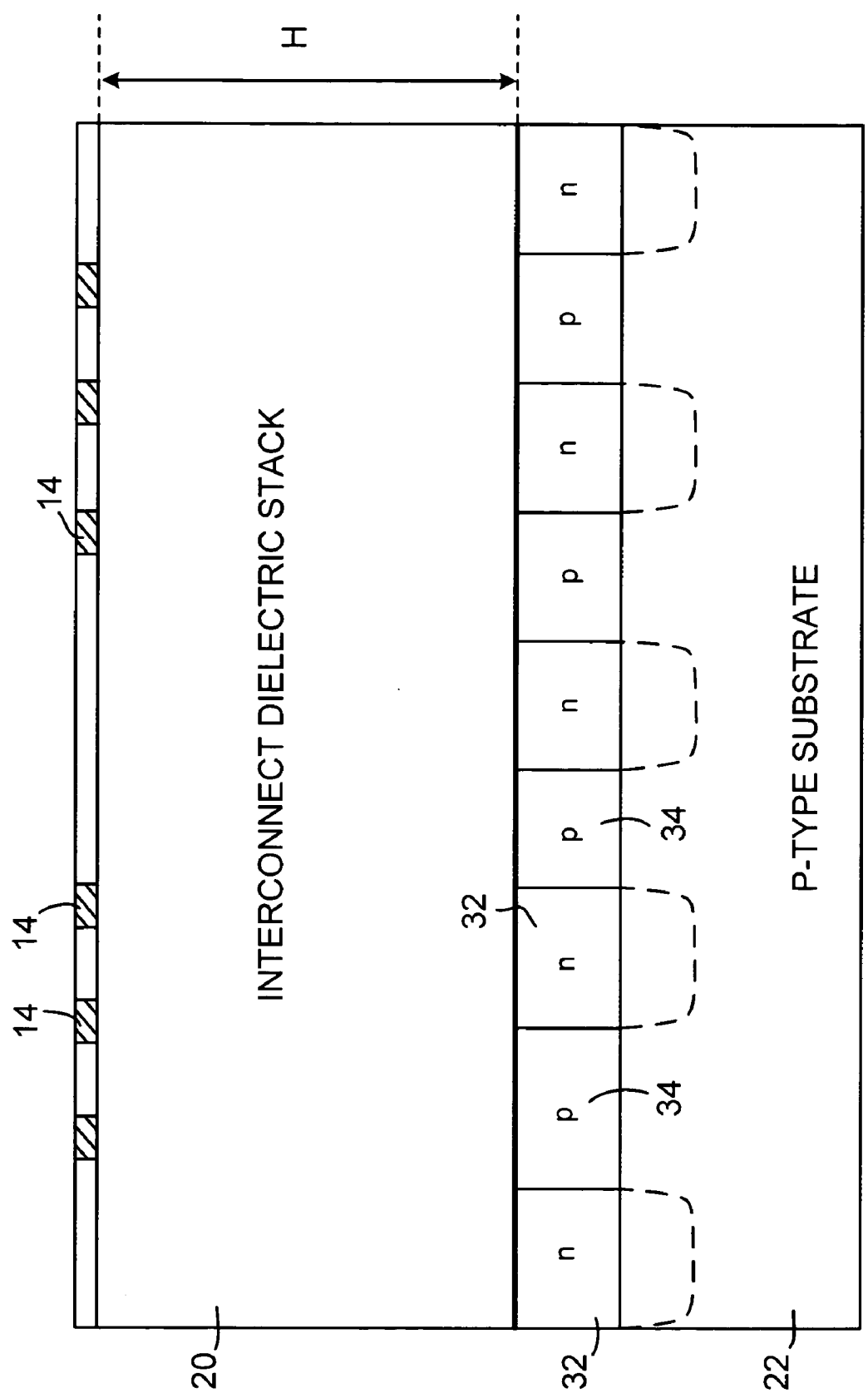
FIG. 5 is a cross-sectional side view of an illustrative integrated circuit inductor in accordance with the present invention.

A cross-sectional side view of the inductor arrangement of FIG. 3 is shown in FIG. 5. The side view of FIG. 5 is taken along line 28 of FIG. 3, as viewed in direction 30. The conductive inductor line 14 is shown in cross-section as being formed from the top layer of interconnects 22 (in this example). The height of the interconnect dielectric stack is H. In a typical process, the top three metal layers (e.g., M7, M8, and M9) may have thicknesses of 0.9 microns each. The intermediate metal layers may each be 0.35 microns thick and the bottom metal layer may be 0.26 microns thick. The intermetal dielectric layers (IMD1, IMD2, etc.), which are sometimes referred to as via-trench layers or via layers, may have comparable thicknesses. Although larger H values reduce the amount of inductor power loss to the substrate through electromagnetic interactions with the substrate, H is generally fixed by the processes selected for forming the active circuitry on circuit 10.

To simplify processing, the depth of the n-type and p-type wells 32 and 34 may be the same as the depth of other n-type and p-type wells being formed during the fabrication of the transistors and other devices on circuit 10. By using the same implantation (or diffusion) steps being used during normal fabrication, the n and p wells 32 and 34 may be added to circuit 10 without adding additional process steps.

A typical well depth for wells 32 and 34 is about 1 micron, but other well depths may be used.

If desired, deeper wells may be formed when a deep-implant process (e.g., a deep n-well process) is available. For example, if active devices on circuit 10 are using a deep n-well implant, this implant may be used to form deep n-wells 32 (e.g., deep n-wells having depths greater than 1 micron) without adding additional steps to the process of fabricating circuit 10. The dotted lines 32' in FIG. 5 show the outlines of such deep n-type wells.

Figure 6:
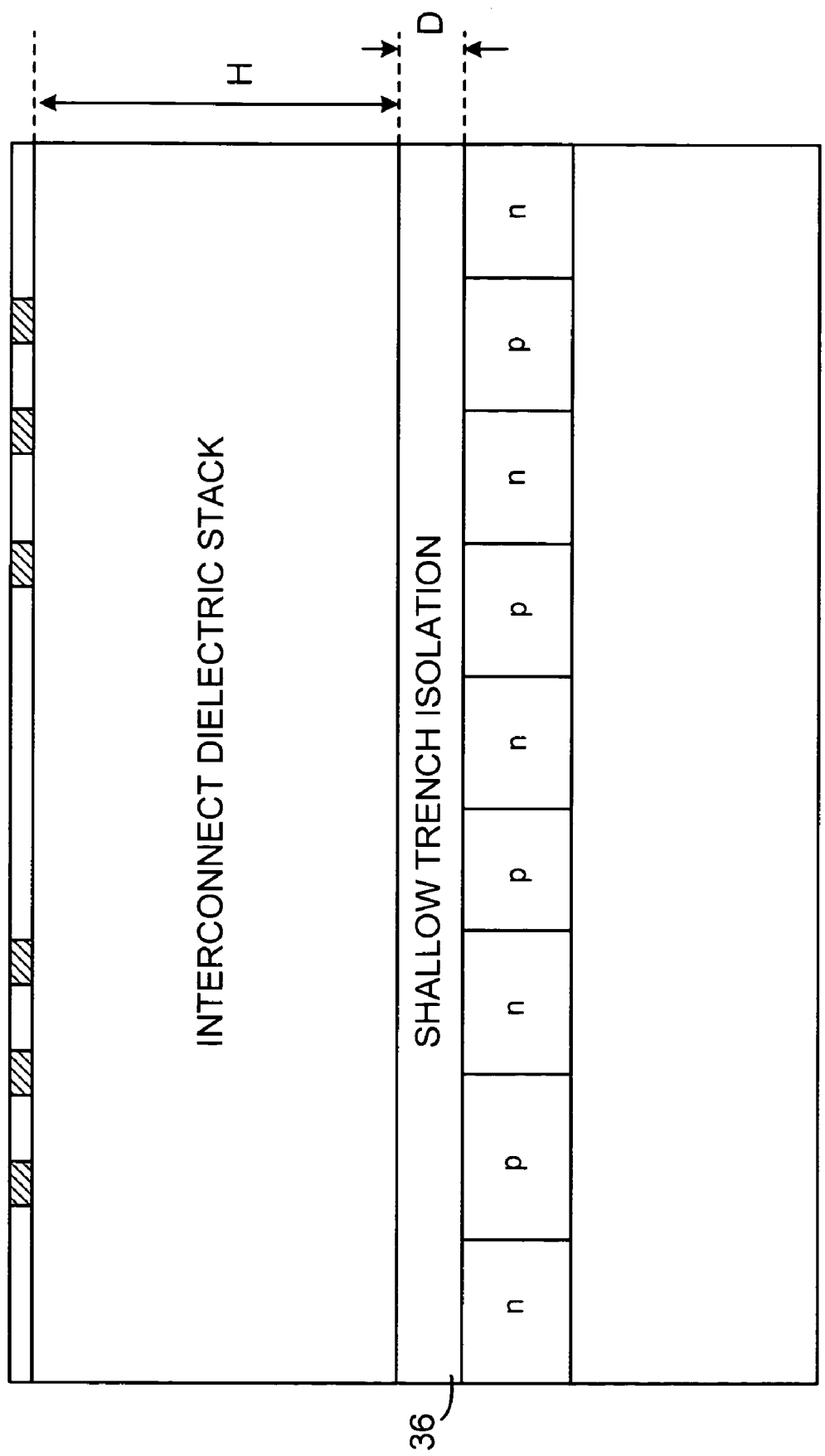
FIG. 6 is a cross-sectional side view of an illustrative integrated circuit inductor structure in which shallow trench isolation is used to reduce energy dissipation in the integrated circuit substrate in accordance with the present invention.

A shallow trench isolation layer 36 may be interposed between the interconnect dielectric stack 22 and the n and p wells 32 and 34, as shown in the cross section of FIG. 6 (which is also taken in direction 30 along line 28 of FIG. 3). When shallow trench isolation is used, the height H of the interconnect stack 22 remains the same, but a layer of semiconductor of depth D is consumed from the substrate surface at the top of the n-wells 32 and p-wells 34. The presence of the shallow trench isolation 36 may improve the eddy-current-blocking performance of the n and p well pattern by providing complete blockage of current flow for the depth D. This is because no current can flow in the shallow trench isolation layer, whereas small amounts of current can flow across the boundaries of the n and p wells.

Figure 7:
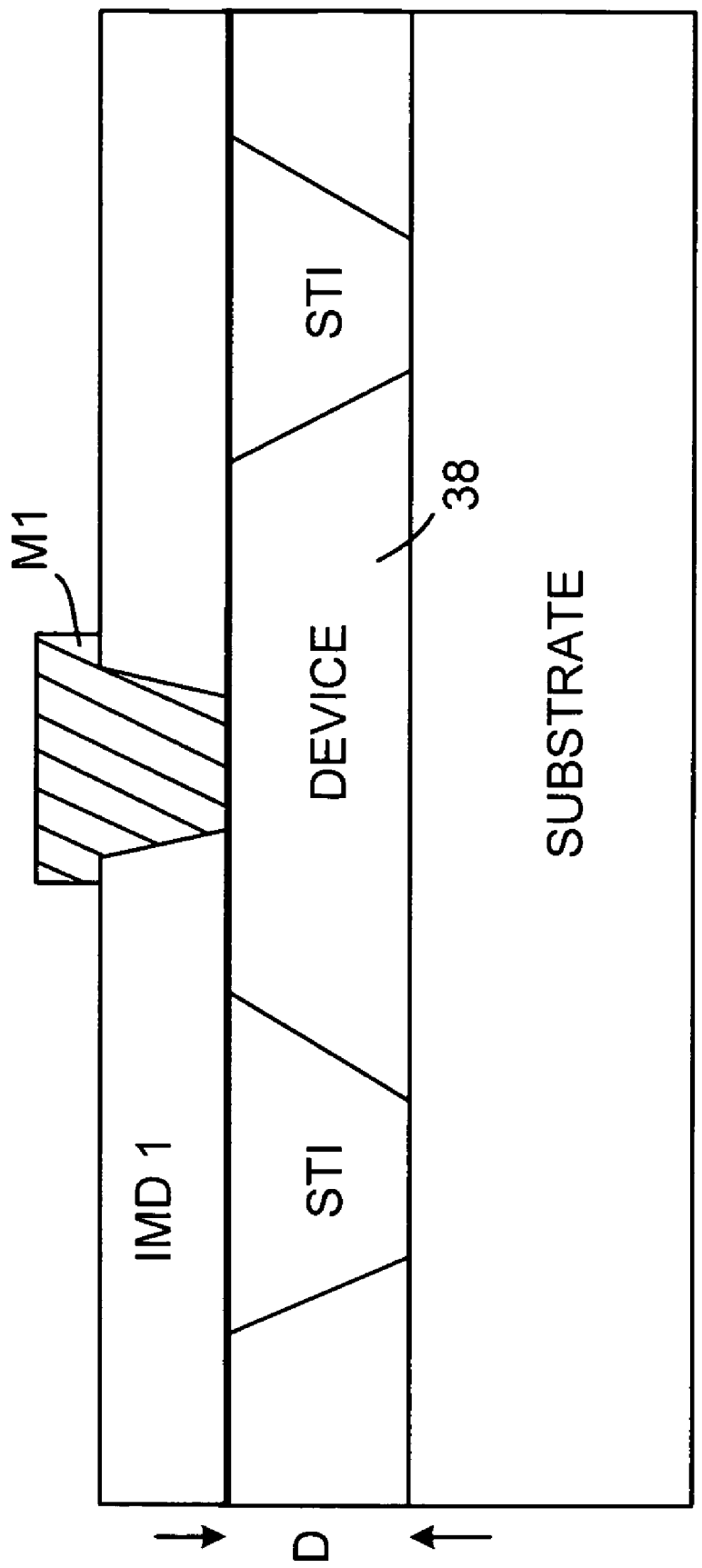
FIG. 7 is a cross-sectional side view of an integrated circuit that may use shallow trench isolation for both device isolation and improved inductor performance in accordance with the present invention.

While shallow trench isolation is being used in a relatively large region under inductor 12 (e.g., all of region 24 of FIGS. 3 and 4), as shown in FIG. 6, the shallow trench isolation structures may also be used to isolate devices such as transistors from circuitry elsewhere on device 10. A cross-sectional view of an illustrative device 38 that is electrically isolated from its environment on circuit 10 using shallow trench isolation (STI) at the same time that the same shallow trench isolation being used to reduce power dissipation in substrate 20 under inductor 12 (FIG. 6) is shown in FIG. 7. The shallow trench isolation structures may be formed using silicon dioxide (when substrate 20 is a silicon substrate) or any other suitable insulator.

Figure 8:
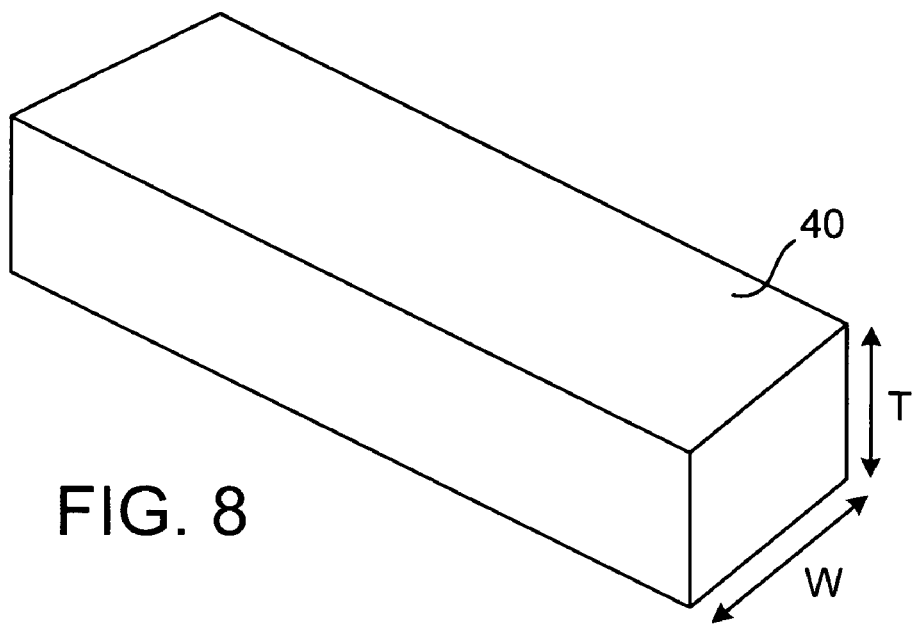
FIG. 8 is a perspective view of a conductive line for use in an integrated circuit inductor in accordance with the present invention.

The conductive inductor line 14 of inductor 12 may be formed of any suitable conductive material. A preferred material is copper, because copper is available using standard semiconductor processes and has a low resistance. A perspective view of an illustrative conductive line 40 that may be used for inductor line 14 is shown in FIG. 8. A typical line width for each line 40 is about 5 microns. The line width for line 40 is generally limited by the design rules of the process being used to form integrated circuit 10.

Circuit 10 may be any suitable circuit such as a programmable logic device, digital signal processing chip, application-specific integrated circuit, or other suitable integrated circuit. Such circuits are typically complex enough that it is not possible to make large (or even small) changes to the overall semiconductor fabrication process just to accommodate the special requirements of a particular component such as inductor 12.

It is therefore desirable to be able to fabricate inductor 12 without imposing additional process step constraints on the circuit fabrication process. One way in which to avoid imposing additional constraints is to use the same metal-layer thicknesses for lines 40 that are already being used for the regular interconnects in the standard metal layers (e.g., M9, M8, M7, etc.). With this type of approach, a typical line thickness for line 40 may be about 0.9 microns (when line 40 and the regular interconnects in the same layer are formed in a thick metal interconnect layer) or about 0.35 microns (for thinner metal interconnect layers).

Figure 9:
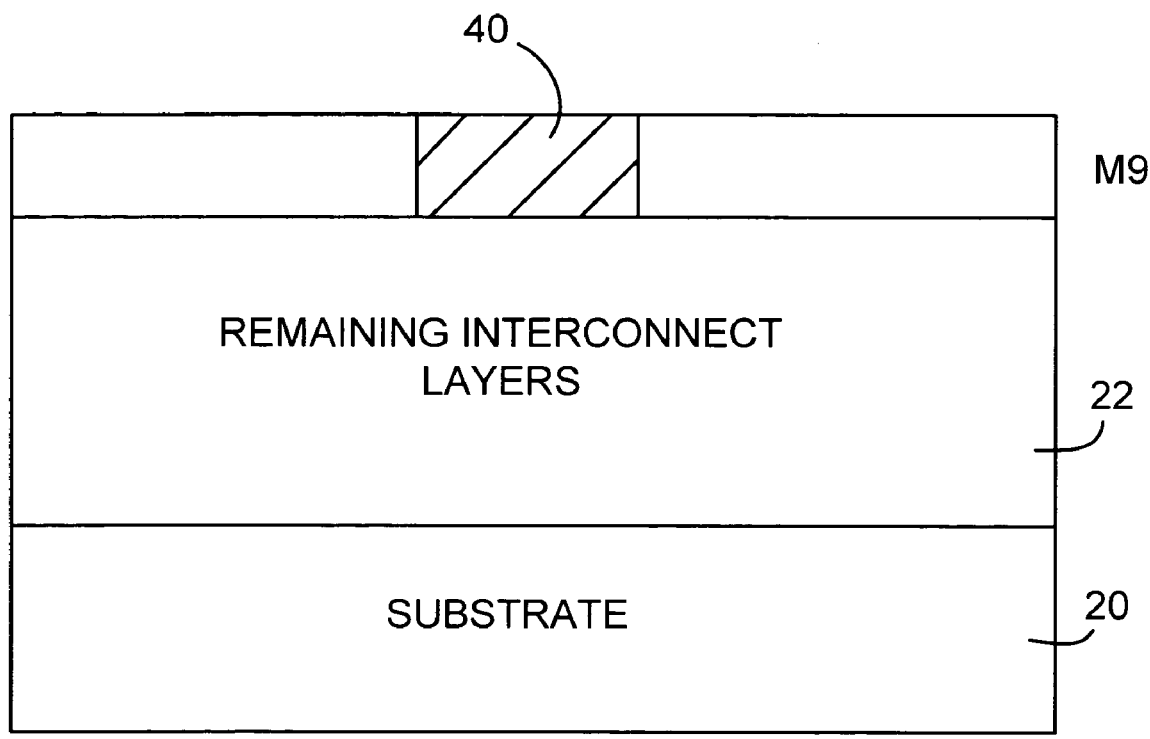
FIG. 9 is a side view of an integrated circuit containing the conductive line of FIG. 8 in accordance with the present invention.

As shown in FIG. 9, at least one of the conductive lines 40 in inductor 12 may be part of the top metal layer (M9) in a nine-metal-layer interconnect stack 22. Particularly when copper is being used as a metal layer material, it may be desirable to use a damascene process to form conductive line 40. With this type of process, copper lines are formed by forming grooves in the metal-layer dielectric layer and by depositing copper in these grooves (e.g., by electroplating). This is followed by a chemical-mechanical planarization (CMP) chemical and mechanical polishing step to planarize the wafer and remove the excess copper in the regions outside of the grooves.

With the so-called "dual-damascene" process, two etch steps are performed before copper deposition and planarization. The first etch step is used to form via-sized holes and via-trench grooves through both the metal-layer dielectric layer and the intermetal dielectric layer dielectric (also referred to as the via-trench dielectric layer, the via-trench layer, etc.). These dielectric layers are typically formed using a fluorosilicate glass or other suitable dielectric insulating material. The second etch step is used to form the grooves for the interconnect lines in the metal-layer dielectric. These grooves can be used to define the locations of the metal conductive lines for the inductor such as line 40 and the lines used for the regular interconnects on circuit 10. After the via-trench grooves and the metal-layer interconnect grooves have been formed, copper can be deposited in the both sets of grooves during the same deposition step to form via-trench conductive lines (also referred to as via-trench conductors) and metal-layer conductive lines (also referred to as metal-layer conductors). The CMP step may then be performed.

Figure 10:
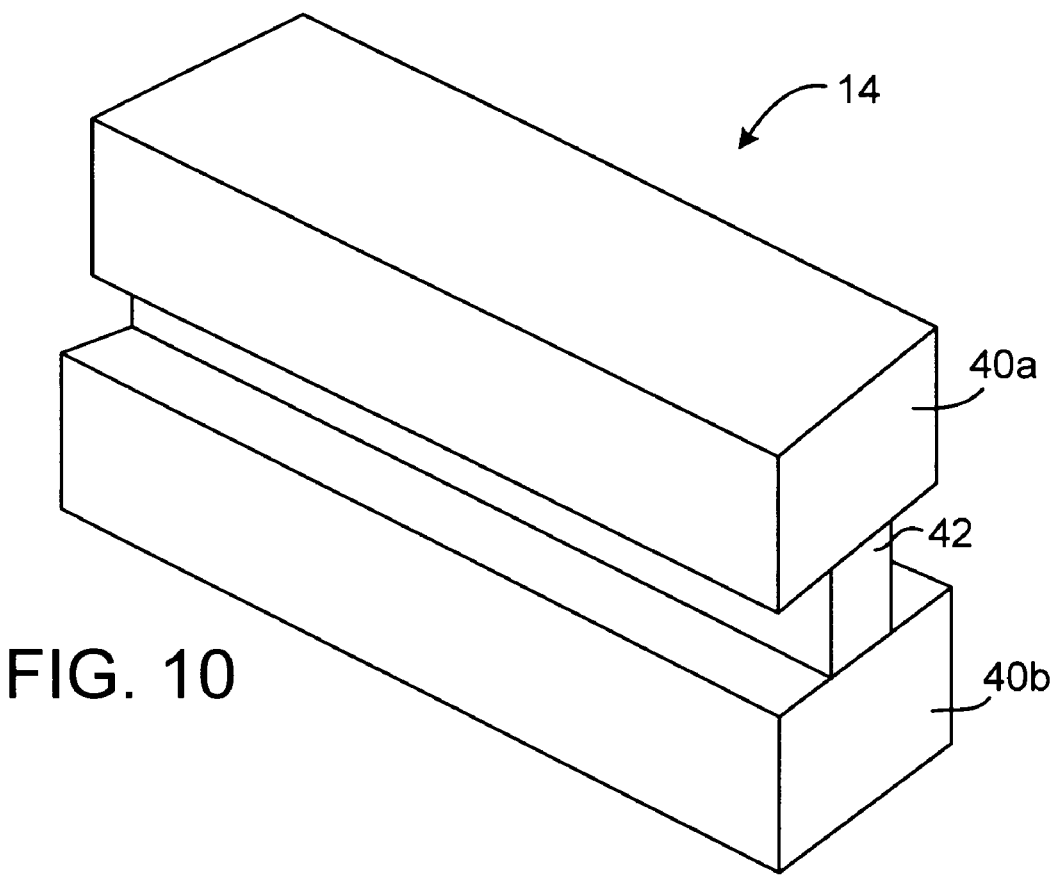
FIG. 10 is a perspective view of an illustrative two-metal-layer conductor structure that may be used to form the conductive lines in an integrated circuit inductor in accordance with the present invention.

To reduce the resistance of the inductor lines 14, a conductive line 40 in a top metal layer (e.g., M9) may be electrically connected with a conductive line in a lower layer (e.g., M8) to form a multi-metal-layer conductive inductor line 14. This approach is shown in FIG. 10. As shown in FIG. 10, an upper-metal-layer conductive line 40a and a lower-metal-layer conductor 40b may be electrically connected using a conductive via-trench line 42. Although it is possible to connect metal-layer conductive lines 40a and 40b using numerous isolated vias or segmented via trenches if desired, it is preferable to use via-trench conductive lines 42 that run the full length of metal-layer conductive lines 40a and 40b uninterrupted (i.e., so that the length of the via-trench conductive lines equals those of the metal-layer conductive lines). This allows the via-trench conductors 42 themselves to serve as an additional parallel conductive path for current. Interruptions in this path could needlessly increase the resistance of the inductor line 14.

Figure 11:
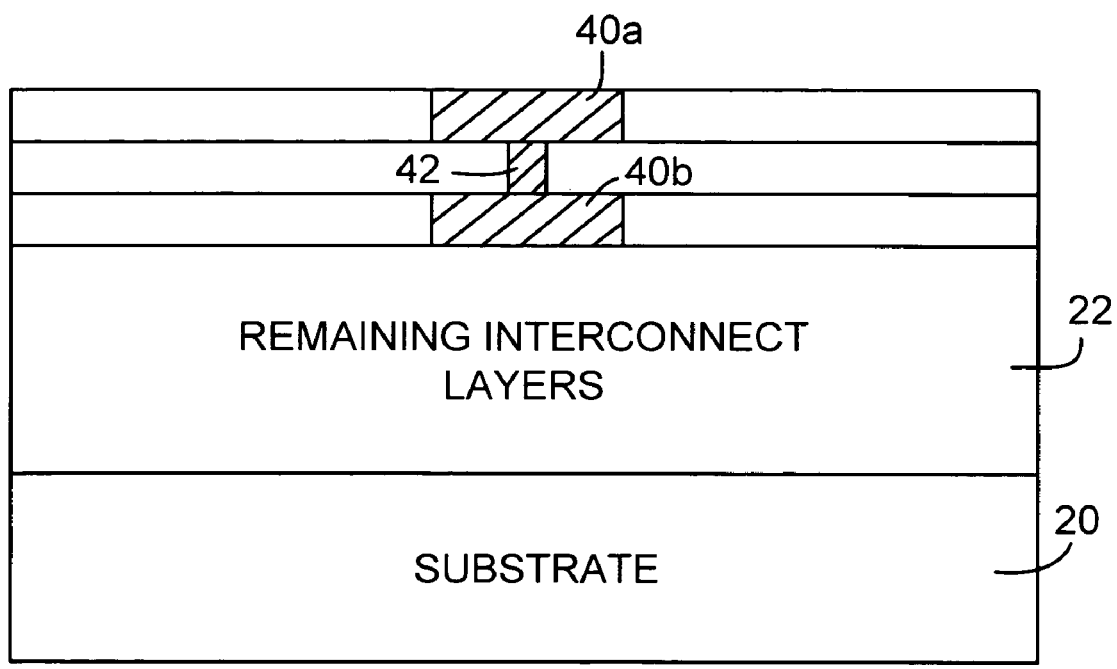
FIG. 11 is a cross-sectional side view of an illustrative integrated circuit having an inductor line formed from a two-metal-layer conductor structure in accordance with the present invention.

A cross-sectional side view of the inductor line 14 of FIG. 10, as implemented in the top two metal layers and the top via layer of an interconnect stack 22 is shown in FIG. 11. Reducing the resistance of line 14 using two parallel connected conductive traces from adjacent metal layers enhances the Q-factor of inductor 12. No additional fabrication process steps are needed, because the via trench formation step may be performed at the same time that conventional via holes are being formed to connect the various interconnects in stack 22.

Figure 12:
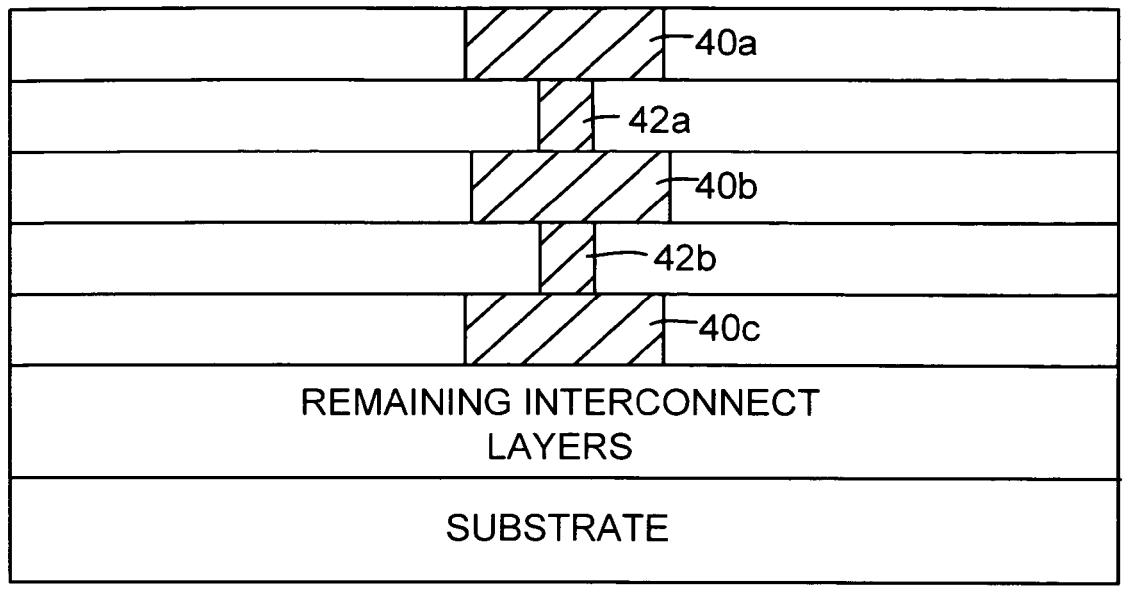
FIG. 12 is a cross-sectional side view of an illustrative integrated circuit showing how conductive lines from three metal layers may be connected using via trenches to form a conductive inductor line for an integrated circuit inductor in accordance with the present invention.

As shown in FIG. 12, conductive lines 40a, 40b, and 40c from three respective metal layers may be interconnected using via-trench conductive lines 42a and 42b formed in respective via-trench dielectric layers. When two vertically-aligned metal-layer conductive lines are interconnected in parallel, the resistance of line 14 is about 2.3 times less than it would be if only a single conductive line 40 were used. When three metal-layer conductive lines are interconnected, the resistance of line 14 is about 3.6 times less than it would be if only a single conductive line 40 were used. Additional layers of metal (e.g., to produce four or more layers of conductive lines 40) may be used if desired.

Figure 13:
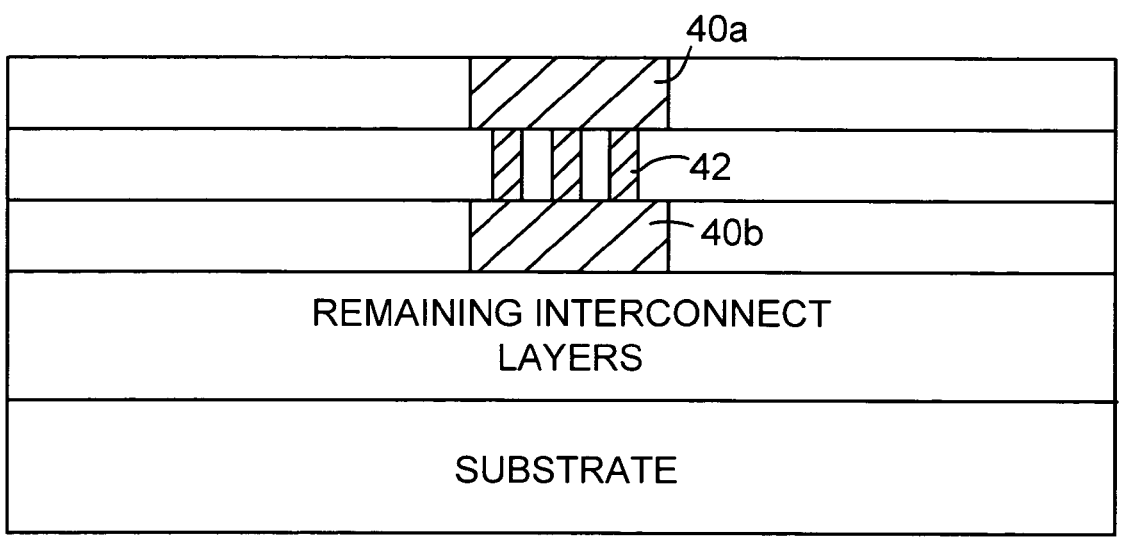
FIG. 13 is a cross-sectional side view of an illustrative integrated circuit showing how multiple parallel via trenches may be used to interconnect metal-layer conductive lines in accordance with the present invention.

Another way in which to reduce the effective resistance of conductive inductor line 14 is to use additional via trenches 42 between each pair of vertically-aligned parallel conductive lines 40. As an example, three parallel via trench conductors 42 may be used to interconnect conductive line 40a and conductive line 40b, as shown in FIG. 13. The use of three via trenches is merely illustrative. For example, one via trench may be used, two via trenches may be used, three via trenches may be used, or more than three via trenches may be used if desired. Moreover, part of conductive inductor line 14 may use one number of via trench conductive lines while another part of line 14 may use another number of via trench conductive lines.

Figure 14:
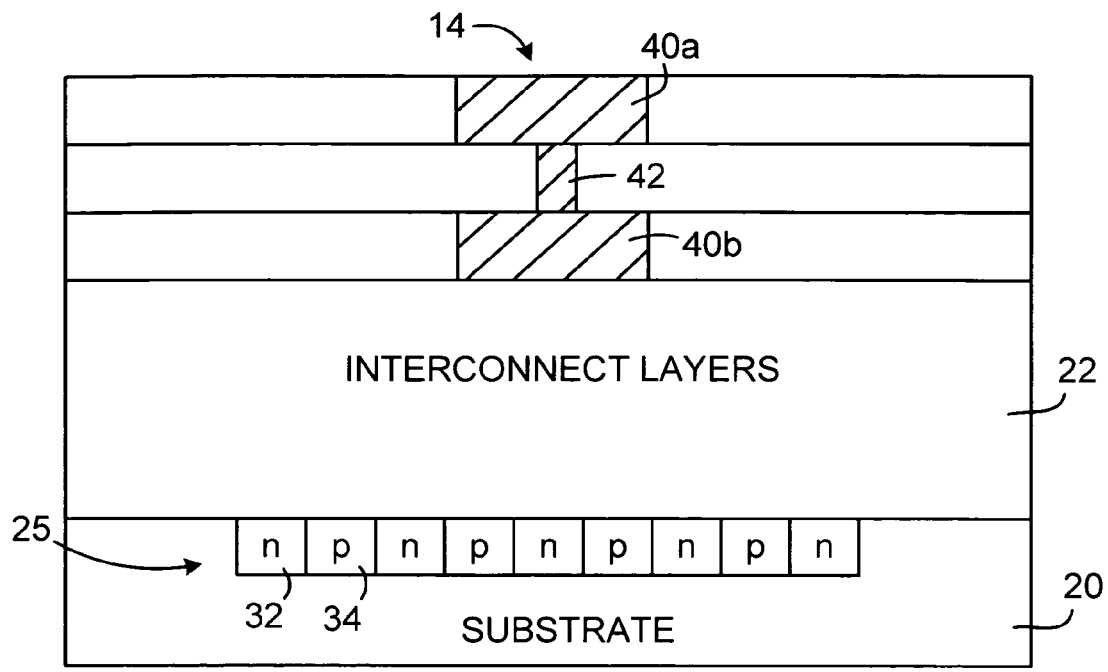
FIG. 14 is a cross-sectional side view of an illustrative integrated circuit in which an alternating p-type and n-type doping pattern has been used to reduce eddy currents in the substrate under a multi-layer integrated circuit inductor in accordance with the present invention.
Figure 15:
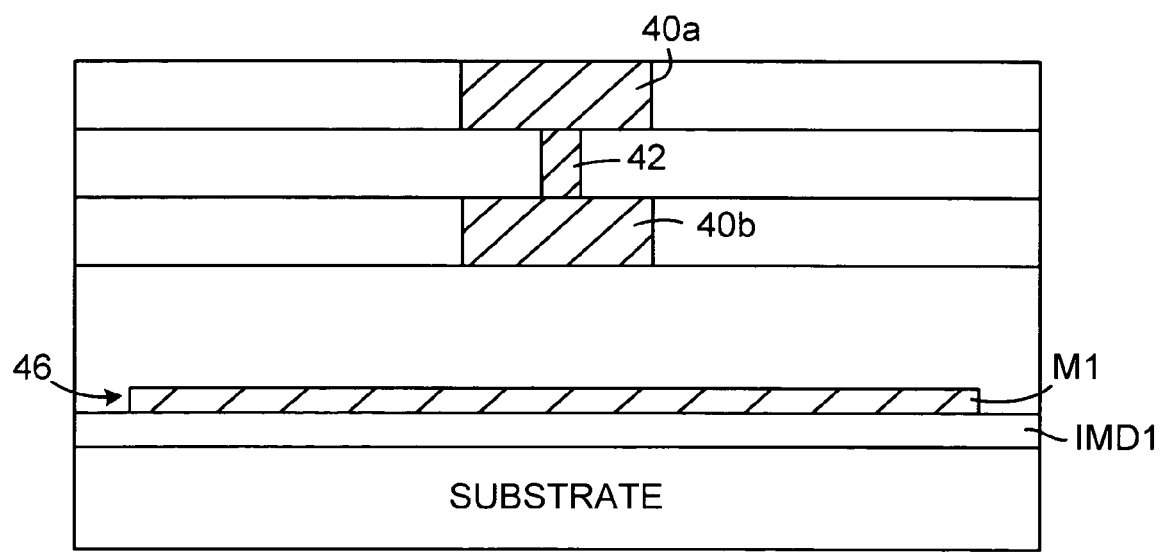
FIG. 15 is a cross-sectional side view of an illustrative integrated circuit in which a buried metal plate formed from an interconnect metal layer has been used to reduce electromagnetic field penetration into the integrated circuit substrate under a multi-layer-metal integrated circuit inductor in accordance with the present invention.

As shown in FIG. 14, a multi-metal-layer conductive inductor line 14 may be placed over an eddy-current-blocking pattern of n-wells and p-wells 32 and 34, as shown in FIG. 14. This type of inductor structure will exhibit Q-factor enhancements both from the reduced resistance of line 14 and from the presence of the region 25 of alternating n-wells and p-wells.

Another possible way to improve Q in an inductor 12 formed from a multi-metal-layer line 14 is to use a blocking metal plate 46 (e.g., a blocking layer formed from metal layer M1) in place of the n-well and p-well region 25. The presence of blocking layer 46 reduces electromagnetic field penetration into substrate 20, which reduces unwanted power dissipation and improves Q.

An illustrative process for forming an inductor line 14 (illustrated in connection with a two-metal-layer scenario) is shown in FIGS. 16–19. The process of FIGS. 16–19 is preferably based on standard integrated circuit processing steps (e.g., the standard steps used to implement a copper dual damascene process), so that line 14 may be formed at the same time that conventional integrated circuit structures (e.g., the top two metal layers of regular interconnects and other upper-layer structures) are being fabricated on circuit 10.

Figure 16:
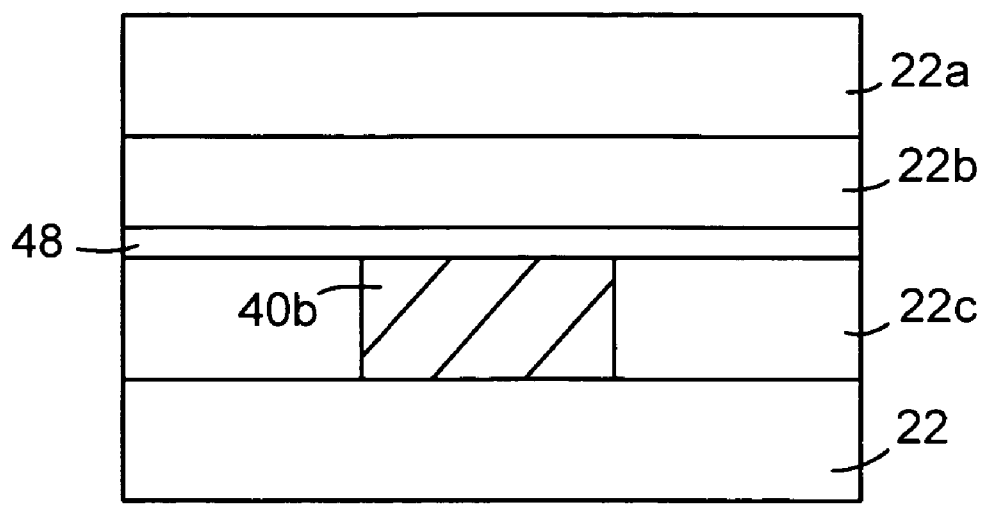
FIG. 16 is a cross-sectional side view of an illustrative two-metal-layer conductive inductor line for an integrated circuit inductor prior to via trench formation in accordance with the present invention.
Figure 17:
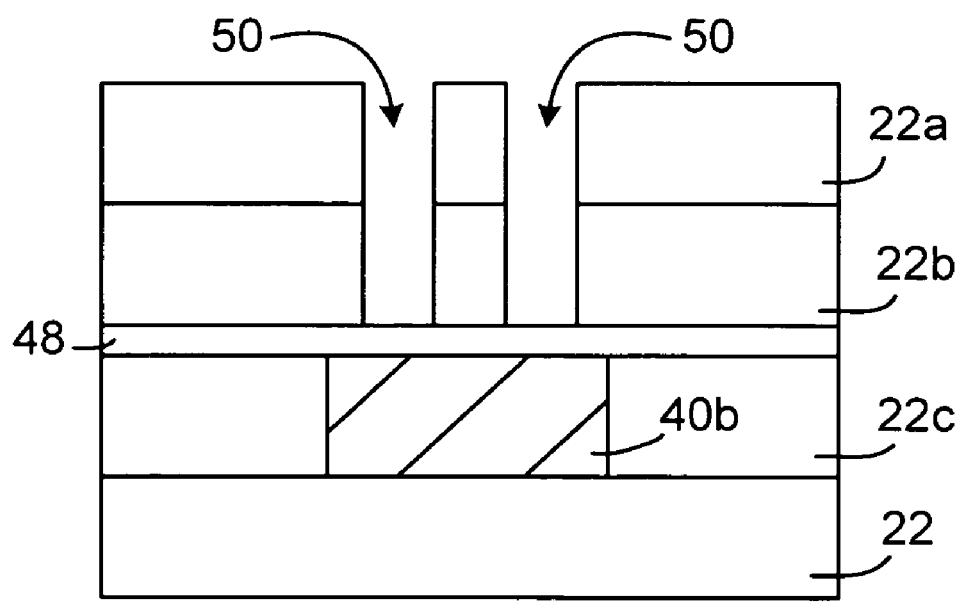
FIG. 17 is a cross-sectional side view of an illustrative two-metal-layer conductive inductor line for an integrated circuit inductor after via trench grooves have been formed in accordance with the present invention.
Figure 18:
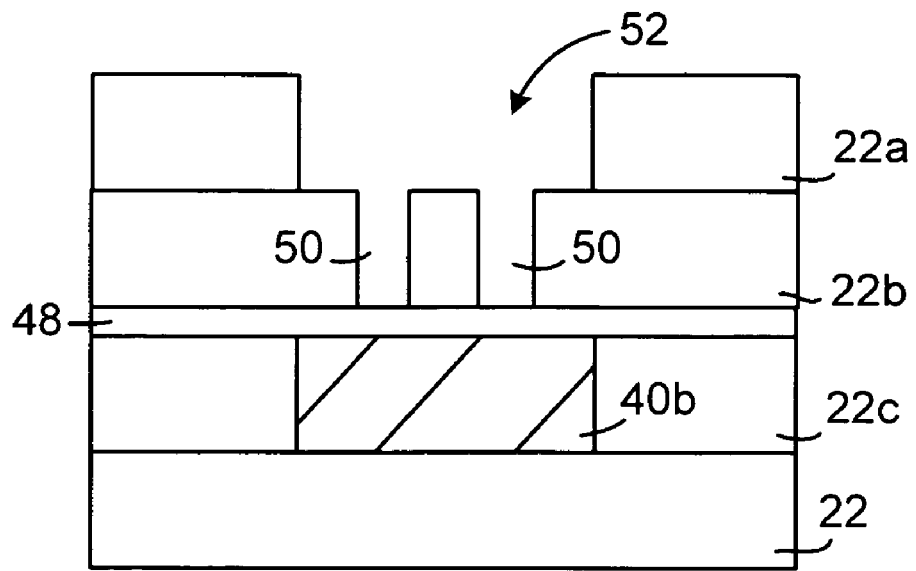
FIG. 18 is a cross-sectional side view of an illustrative two-metal-layer conductive inductor line for an integrated circuit inductor after top-layer metal line groove formation in accordance with the present invention.
Figure 19:
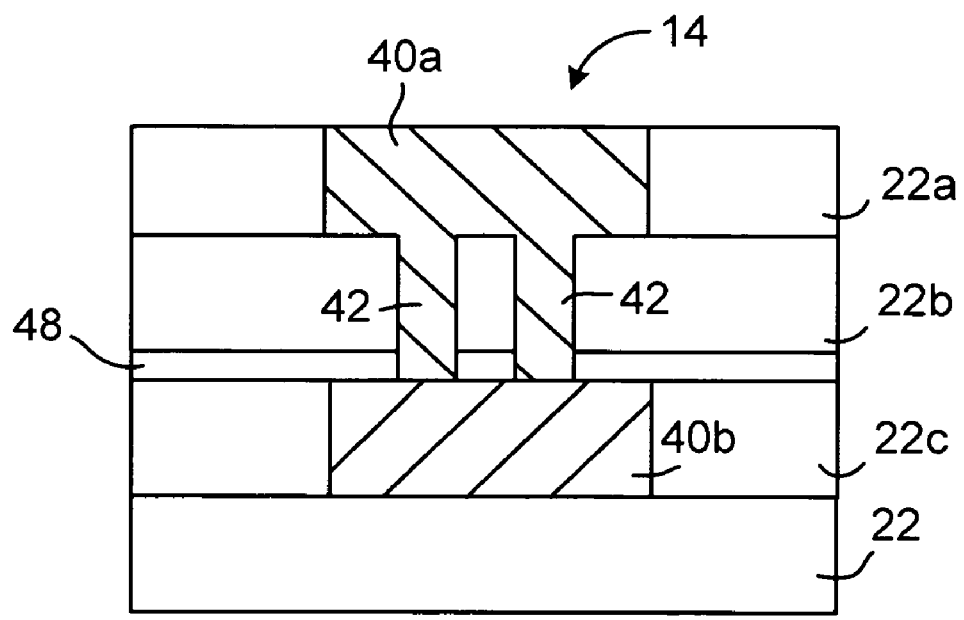
FIG. 19 is a cross-sectional side view of an illustrative two-metal-layer conductive inductor line for an integrated circuit inductor after the conductive lines of the upper and lower metal layers have been joined by two parallel via trench conductors in accordance with the present invention.

As shown in FIG. 16, a conductive line 40b has already been formed in layer 22c (e.g., metal layer M8). Conductive line 40b in layer 22c is surrounded by dielectric material (e.g., fluorosilicate glass, or, if desired, an oxide, polymer, or other suitable insulating dielectric). FIGS. 17–19 illustrate how a similar metal-layer conductive line (conductive line 40a) and via trench conductive line 42 may be formed within their respective dielectric layers (i.e., metal-layer dielectric layer 22a and via-trench dielectric layer 22b).

As shown in FIG. 16, an etch stop layer 48 such as a silicon nitride layer may be formed between layers such as metal-layer dielectric layer 22c and via-trench dielectric layer 22b.

As shown in FIG. 17, when trenches 50 are etched through layers 22a and 22b, the etch stop layer 48 helps to prevent the trenches 50 from penetrating and potentially damaging conductor 40b. Any suitable technique may be used for etching the dielectric layers 22 such as chorine-based plasma etching. The trench etch process forms trenches 50 that pass through both the dielectric of metal layer 22a and the dielectric of via layer 22b. Two trenches 50 have been formed in this example, but one, two, three, or more trenches may be formed if desired.

After the trenches 50 have been formed, trenches 50 may be backfilled with photoresist or any other suitable material that can act as a protective layer to protect the etch stop layer 48.

As shown in FIG. 18, during a metal-layer etch step, a (wider) trench 52 is formed though the top layer 22a. A timed etch may be used to ensure that the etch penetrates to the proper depth into the interconnect dielectric stack 22. The photoresist may then be removed (e.g., using an oxygen plasma).

At the stage of the fabrication process shown in FIG. 18, two types of trenches have been formed. Narrow via trenches have been formed through the via-layer dielectric of layer 22b. A wider metal-layer trench has been formed through metal-layer dielectric layer 22a.

To form a good ohmic contact to the metal in layer 22c (e.g., conductor 40b), the etch stop layer 48 should be removed (e.g., using a gentle silicon nitride etch). Following metal deposition (e.g., copper deposition) and CMP polishing, the upper conductor 40a lying within the dielectric of metal-layer 22a is electrically connected to the lower conductor 40b lying within the dielectric of metal-layer 22c using via-trench conductors 42 formed though the dielectric of via-layer 22b.

An advantage of using multiple relatively-narrow via trenches 50 as opposed to using a trench having a line-sized width (i.e., the same width as conductor 40b) when connecting the conductors of layers 22a and 22c is that when the etch stop layer 48 at the bottom of the trenches is removed, the underlying metal (e.g., the copper of conductor 40b) is not damaged by over-etching. If a via-layer groove of the same width as the conductive line 40b were to be used, the upper copper surface of conductor 40b could be damaged by too much exposure to enchant during the etch-stop removal, which could lead to poor adhesion of subsequent metal layers. Etching an overly-wide groove through via layer 22b might also cause the copper of conductor 40b to splatter onto the sides of the trench. Such sidewall metal deposition can also give rise to reliability problems.

Accordingly, when using the double damascene process of the type shown in FIGS. 16–19 to interconnect multiple vertically-aligned conductors such as conductors 40a and 40b to form an inductor line 14, it is beneficial to use one or more parallel via trenches 42 whose widths are less than the widths of conductors 40a and 40b. As an example, lines 40a and 40b may be 5 microns wide and trenches 42 may be one micron wide. When working within the constraints of a standard integrated circuit fabrication process, the maximum widths of lines 40a and 40b and via-trench conductive lines 42 are generally dictated by the design rules associated with the process.

Figure 20:
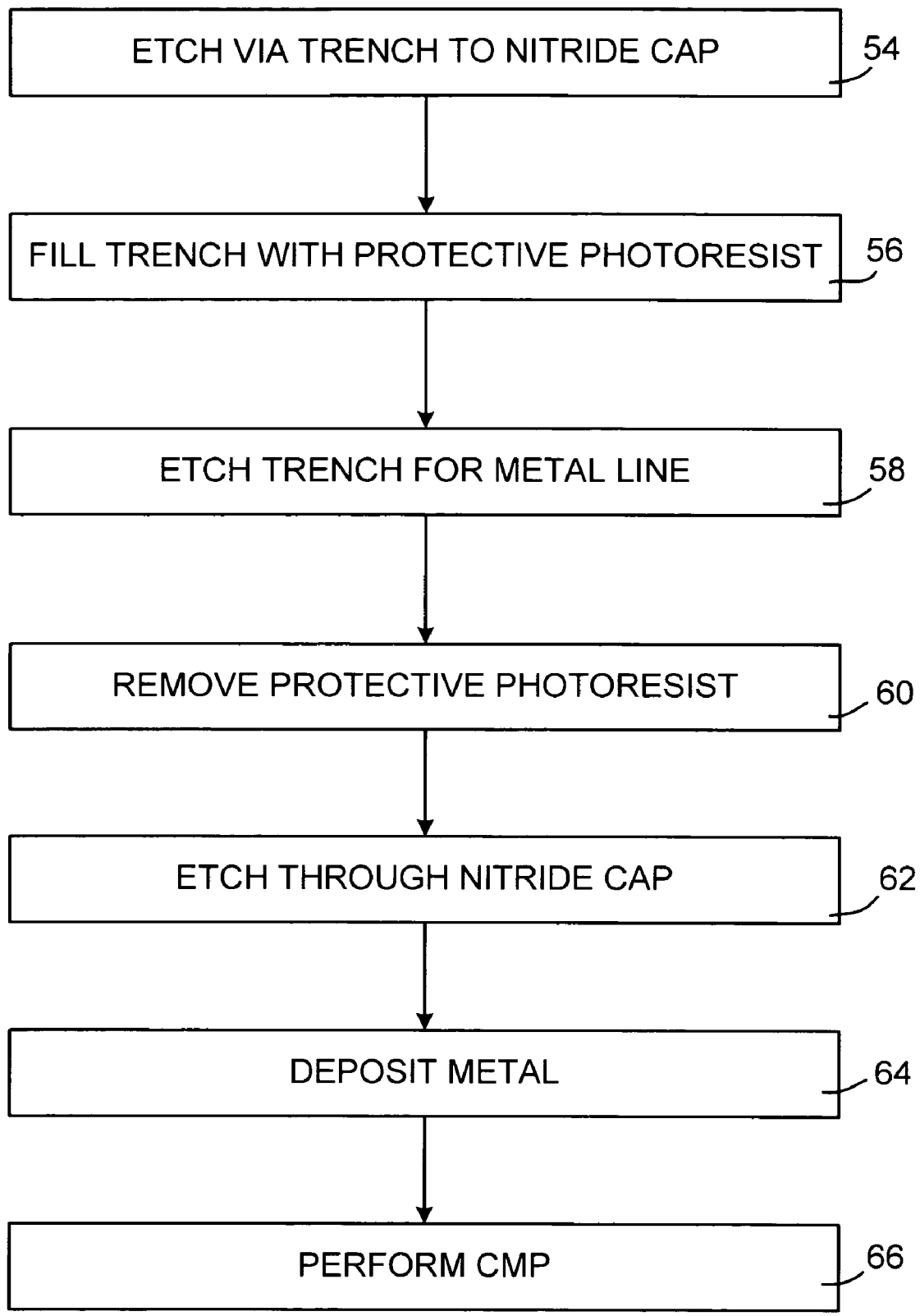
FIG. 20 is a flow chart of illustrative steps involved in forming multi-layer conductive inductor lines for integrated circuit inductors in accordance with the present invention.

Some of the steps involved in using the dual damascene process to form integrated circuit inductor lines such as inductor line 14 of FIG. 19 are shown in FIG. 20.

At step 54, a dielectric etch is performed to form via-width trenches 50 through dielectric layers 22a and 22b (FIG. 17). When an etch stop layer such as etch stop layer 48 of FIG. 17 is used, the dielectric etch of step 54 is terminated at the appropriate depth by the etch stop layer 48.

At step 56, the via-width trenches may be filled with a protective material such as photoresist.

At step 58, a wider trench 52 may be etched. The trench 52 may be etched to the appropriate depth (about the same as the thickness of the top metal-layer dielectric) using a timed etch procedure. The trench 52 may be made as wide as permitted by the design rule (which is dictated by the overall fabrication process being used).

At step 60, the protective photoresist remaining at the bottom of trenches 50 may be removed, leaving a structure of the type shown in FIG. 18.

At step 62, the portion of the etch stop layer 48 that is exposed at the bottom of trenches 50 may be removed (e.g., using a silicon nitride etch when the etch stop layer is formed of silicon nitride). Because the via trench structures are not too wide, the structures are not damaged by over-etching, which could otherwise lead to reliability problems.

At step 64, the relatively-narrow via trenches 50 and the relatively wider trench 52 may be filled with metal (e.g., copper). The copper that has been deposited into the trenches forms an upper layer conductor 40a and forms associated conductive via trench conductors 42 as shown in FIG. 19.

Following metal deposition, a CMP polishing step may be performed to planarize the wafer and to remove excess metal.

The structures shown in FIGS. 16–19 are somewhat idealized, because the effects of conductor "dishing" and via-trench "blow-out" are not shown.

The dishing effect arises when a relatively soft material lies adjacent to a relatively hard material during CMP planarization. During exposure to the CMP process, more of the softer material is removed than the hard material, leading to a depression in the surface of the soft material. The effect is present, for example, when copper lines embedded in fluorosilicate glass are polished using CMP.

Figure 21:
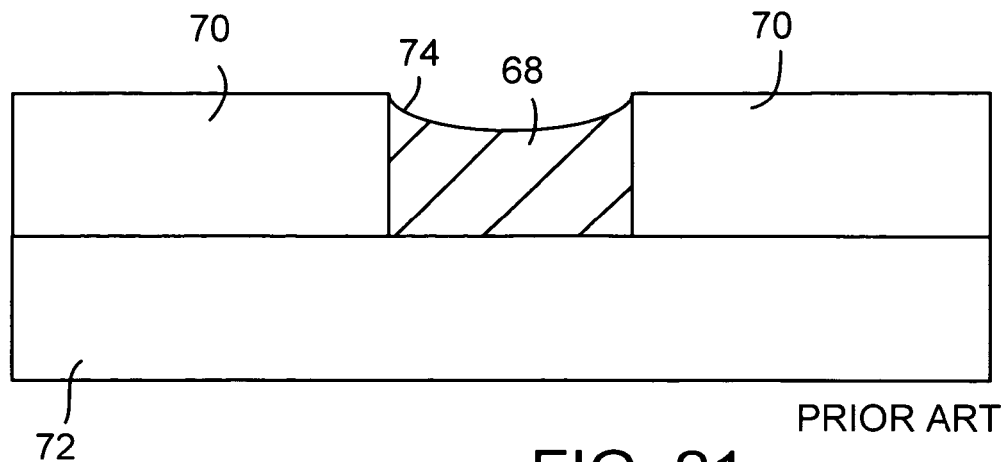
FIG. 21 is a cross-sectional side view of a conductive line exhibiting the effects of dishing.

An illustrative cross-section of a copper line 68 that is embedded within a fluorosilicate glass layer 70 (and that rests on another fluorosilicate glass layer 72) is shown in FIG. 21. As shown in FIG. 21, the profile of copper line 68 exhibits concavity (dishing) after planarization using CMP. The concavity results in a concave top conductor surface 74 on conductor 68.

When forming an inductor line 14 from multiple vertically-aligned conductors 40, the dishing effect may be used to produce upper-level conductors 40 that have lower resistances than would otherwise be possible.

Figure 22:
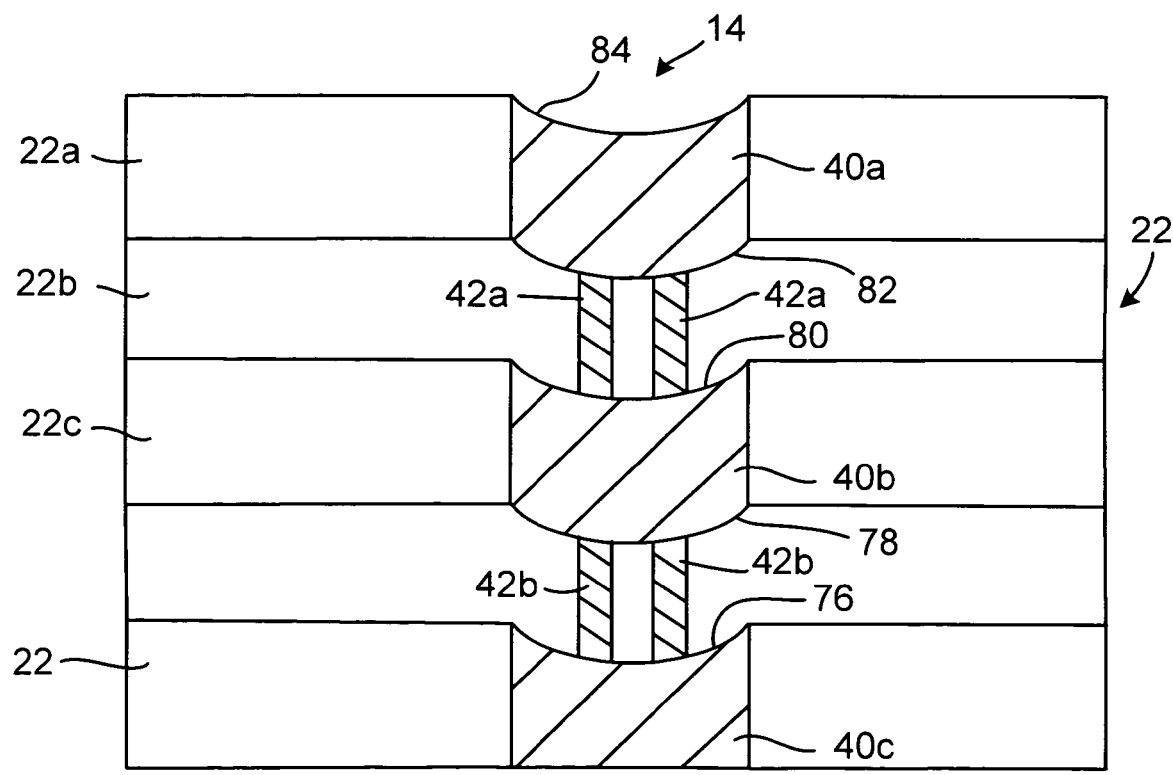
FIG. 22 is a cross-sectional side view of an illustrative multi-metal-layer conductive line for an integrated circuit inductor that has been formed using the dishing effect in accordance with the present invention.

An illustrative line 14 that has benefited from the dishing effect is shown in FIG. 22. In the example of FIG. 22, line 14 has been formed from three metal conductors 40a, 40b, and 40c. Conductors 40a, 40b, and 40c may, for example, be copper conductors formed in an interconnect dielectric such as fluorosilicate glass. Other suitable conductive and insulating material systems may be used in interconnect stack 22 if desired.

As shown in FIG. 22, conductors 40a and 40b are interconnected by via trenches 42a. Conductors 40b and 40c are interconnected by via trenches 42b. Although the respective layers of conductive lines in FIG. 22 are shown as being connected by two parallel via trenches each, this is merely illustrative. Any suitable number of via trenches may be used to connect the conductors 40a, 40b, and 40c if desired.

If only a single-layer conductor such as conductor 68 of FIG. 21 were used in inductor line 14 of FIG. 22, the resistance of that conductor would be increased due to the concave surface 74. This is because the concavity in the upper surface reduces the cross-sectional area of conductor 68.

When multiple conductors 40 are placed in vertical alignment, the concavity in the upper surfaces of the lower conductors causes a matching convex shape to form in the bottom of the next conductor up in the stack. This convexity compensates for the loss of resistance from the concavity on the conductor's upper surface.

As an example, the concave upper surface 76 of conductor 40c gives rise to a corresponding convex lower surface 78 for conductor 40b. The resulting additional cross-sectional area of conductor 40b makes the resistance of conductor 40b less than it would have been if the lower conductor 40*c* had not been present (even excluding the additional conduction provided by trenches 42*b* and conductor 40*c*). Similarly, the concave upper surface 80 of conductor 40*b* creates a corresponding convex bulge in the lower surface 82 of conductor 40*a*, which helps to compensate for the loss of cross-sectional area that arises when there is dishing on the upper surface 84 of conductor 40*a*.

Figure 23:
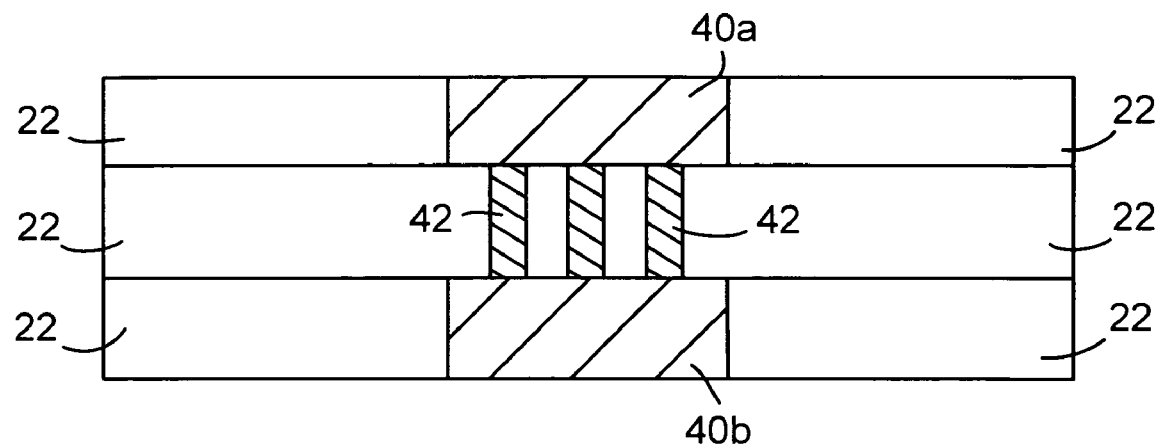
FIG. 23 is a cross-sectional view of an inductor line formed using via-layer trenches with perfectly vertical sidewalls in accordance with the present invention.
Figure 24:
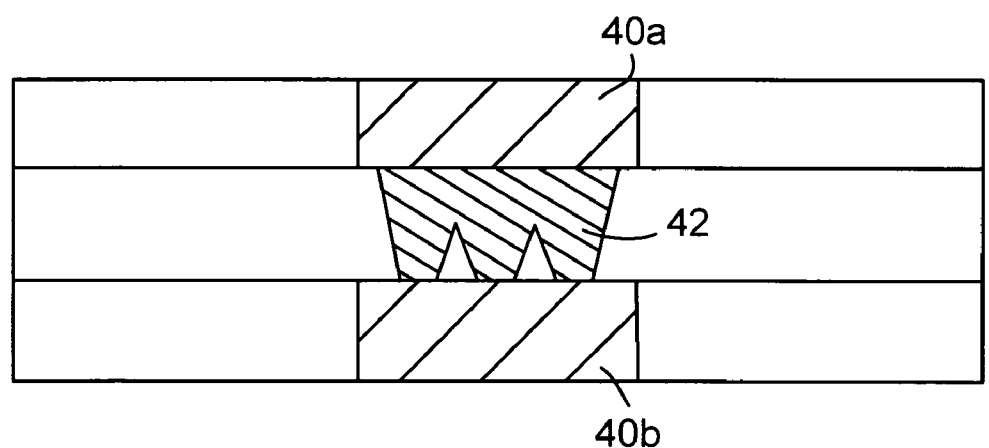
FIG. 24 is a cross-sectional view of an inductor line in which the via-layer trenches have been allowed to merge during trench etching in accordance with the present invention.

The effects of trench blowout are illustrated in FIGS. 23 and 24. An idealized cross-section of two conductors 40*a* and 40*b* and corresponding via trenches 42 are shown in FIG. 23. In the idealized cross-section, the trenches 42 have perfectly vertical sidewalls. Via trenches 42 having such vertical sidewalls may be used if desired. By using via trenches 42 to electrically interconnect upper conductor 40*a* to lower conductor 40*b*, the overall resistance of line 14 may be reduced and the Q-factor of inductor 12 may be improved.

Sometimes the etch process by which via trenches are formed through the dielectric layers 22 (e.g., the chlorine-based plasma etch being used) leads to a widening of the tops of trenches 42. This type of situation is shown in FIG. 24. As shown in FIG. 24, the cross-sectional width of trenches 42 at the bottom of each of the three trenches may be comparable to the width of the trenches 42 in the vertical-sidewall example of FIG. 23. However, at the top of each of the trenches 42, the trenches widen. In the illustrative example of FIG. 24, the trenches have widened to such an extent that adjacent trenches impinge upon each other. This type of "blowout" of the trenches causes the trenches to merge near their tops to create a unified trench conductor structure. Because there is more conductive material in this type of structure than there is in a comparably-sized vertical-sidewall trench arrangement of the type shown in FIG. 23, the merged trench structure of FIG. 24 may reduce the resistance of inductor line 14 and can produce an improved Q-factor for inductor 12.

Although the trenches 42 may merge at the top of the trenches due to the blowout effect, it is still advantageous to use individual trenches 42 rather than attempting to form a solid groove having a width that matches the widths of conductive lines 40*a* and 40*b*. Attempting to form such a wide groove in the via layer dielectric would generally violate the design rules of standard integrated circuit fabrication processes. Trenches such as trenches 42 are generally acceptable for use with standard fabrication processes. Via-layer trenches are often used at the periphery of integrated circuits for die sealing. Accordingly, it may be desirable to form via trenches 42 for inductor line 14 during the same etch step that such die sealing trenches are being formed.

The foregoing is merely illustrative of the principles of this invention and various modifications can be made by those skilled in the art without departing from the scope and spirit of the invention.

What is claimed is:

1. An integrated circuit inductor formed in an interconnect dielectric stack on an integrated circuit, comprising:
    at least two metal-layer conductive lines that run parallel to each other in respective metal-layer dielectric layers in the interconnect dielectric stack; and
    at least one via-trench conductive line in a via-trench dielectric layer in the interconnect stack, wherein the via-trench conductive line lies between the two metal-layer conductive lines, runs parallel to the two metal-layer conductive lines, and electrically connects the two metal-layer conductive lines.

2. The integrated circuit inductor defined in claim 1 wherein the metal-layer conductive lines and the via-trench conductive line comprise copper.

3. The integrated circuit inductor defined in claim 1 wherein the metal-layer conductive lines each form a spiral between first and second inductor terminals.

4. The integrated circuit inductor defined in claim 1 wherein there are at least three vertically-aligned metal-layer conductive lines that run parallel to each other, each in a different respective metal-layer dielectric layer in the interconnect dielectric stack, and wherein there are at least two sets of via-trench conductive lines, each set having at least one via-trench conductive line that electrically connects two of the three metal-layer conductive lines.

5. The integrated circuit inductor defined in claim 1 comprising at least two via-trench conductive lines between the two metal-layer conductive lines, wherein the two via-trench conductive lines electrically connect the two metal-layer conductive lines.

6. The integrated circuit inductor defined in claim 1 comprising at least two via-trench conductive lines between the two metal-layer conductive lines that electrically connect the two metal-layer conductive lines, wherein each via-trench conductive line has a bottom width and an upper width and wherein the bottom widths are less than the upper widths so that the via trenches merge at the top of the via-trench conductive lines.

7. The integrated circuit inductor defined in claim 1 wherein each of the metal-layer conductive lines has a length and the via-trench conductive line has a length, and wherein the length of the via-trench conductive line is equal to the length of the metal-layer conductive lines.

8. The integrated circuit inductor defined in claim 1 wherein the metal-layer conductive lines and the via-trench conductive line comprise copper and wherein the metal-layer conductive lines and via-trench conductive line are formed using a damascene semiconductor fabrication process.

9. The integrated circuit inductor defined in claim 1 wherein the metal-layer conductive lines and the via-trench conductive line comprise copper and wherein at least one of the metal-layer conductive lines and the via-trench conductive lines are formed using a dual-damascene semiconductor fabrication process.

10. The integrated circuit inductor defined in claim 1 wherein the interconnect dielectric stack has a top metal-layer dielectric layer, and wherein one of the metal-layer conductive lines is formed in the top metal-layer dielectric layer.

11. The integrated circuit inductor defined in claim 1 wherein the metal-layer conductive lines comprise upper and lower parallel metal-layer conductive lines in the interconnect dielectric stack and wherein the lower parallel metal-layer conductive line has a concave upper surface due to dishing and the upper parallel metal-layer conductive line has a convex lower surface from being formed on top of the concave upper surface of the lower metal-layer conductive line.

12. The integrated circuit inductor defined in claim 1 wherein the interconnect dielectric stack lies on the surface of a semiconductor substrate, the integrated circuit inductor further comprising a metal plate between the two metal layer conductive lines and the surface of the semiconductor substrate to reduce electromagnetic field interactions between the integrated circuit inductor and the semiconductor substrate.

13. The integrated circuit inductor defined in claim 1 wherein the interconnect dielectric stack lies on the surface of a semiconductor substrate, the integrated circuit inductor further comprising a plurality of n-type and p-type wells at the surface of the semiconductor substrate that form a plurality of reverse-biased diodes that block eddy currents from flowing in the semiconductor substrate when the integrated circuit inductor is operated.

14. The integrated circuit inductor defined in claim 13 wherein the n-type and p-type wells include at least some deep wells having depths greater than one micron.

15. The integrated circuit inductor defined in claim 13 further comprising a region of shallow trench isolation that is formed on the surface of the semiconductor substrate between the n-type and p-type wells and the interconnect dielectric stack.

16. The integrated circuit inductor defined in claim 13 wherein the two metal-layer conductive lines comprise at least two square metal-layer spirals interconnected by a square spiral via trench and wherein the square spirals have lateral dimensions of less than 200 microns.

17. An integrated circuit inductor formed in an interconnect dielectric stack on an integrated circuit, comprising:
    at least three spiral metal-layer conductive lines that run parallel to each other in respective metal-layer dielectric layers in the interconnect dielectric stack; and
    at least two via-trench conductive lines each of which lies in a via-trench dielectric layer in the interconnect stack, wherein each via-trench conductive line lies between a respective two of the metal-layer conductive lines, runs parallel to those two metal-layer conductive lines, and electrically connects those two metal-layer conductive lines.

18. The integrated circuit inductor defined in claim 17 wherein the metal-layer conductive lines and the via-trench conductive lines comprise copper and wherein the metal-layer conductive lines and the via-trench conductive lines are formed using a dual-damascene semiconductor fabrication process.

19. An integrated circuit inductor formed in an interconnect dielectric stack that lies on the surface of a semiconductor substrate in an integrated circuit, comprising:
    at least two metal-layer conductive lines that run parallel to each other in respective metal-layer dielectric layers in the interconnect dielectric stack;
    at least one conductor in a via-trench dielectric layer in the interconnect stack that electrically connects the two metal-layer conductive lines; and
    a region of shallow trench isolation that is formed on the surface of the semiconductor substrate under the two metal-layer conductive lines, wherein the conductor comprises a via-trench conductive line that runs parallel to the metal-layer conductive lines.

20. The integrated circuit inductor defined in claim 19 further comprising a plurality of n-type and p-type wells in the semiconductor substrate under the two metal-layer conductive lines that form a plurality of reverse-biased diodes that block eddy currents from flowing in the semiconductor substrate when the integrated circuit inductor is operated.

21. The integrated circuit inductor defined in claim 19 wherein the two metal-layer conductive lines and the via-trench conductive line are spiral.

22. A method of forming an integrated circuit inductor for an integrated circuit with a dielectric interconnect stack on a semiconductor substrate, comprising:
    forming at least two vertically-aligned metal-layer conductive lines in respective metal-layer dielectric layers in the dielectric interconnect stack using a damascene process; and
    forming at least one via-trench conductive line in a via-layer dielectric layer in the dielectric interconnect stack using the damascene process, wherein the via-trench conductive line runs parallel to the two metal-layer conductive lines and electrically interconnects the two metal-layer conductive lines.

23. The method defined in claim 22 wherein the integrated circuit inductor has a Q-factor, the method further comprising:
    forming the conductive inductor line in a spiral; and
    forming a region of n-type and p-type wells beneath the spiral to prevent eddy currents from reducing the Q-factor during operation of the inductor.

24. The method defined in claim 22 further comprising forming a plurality of parallel via-trench conductive lines between the two metal-layer conductive lines.

25. The method defined in claim 24 further comprising forming a plurality of parallel via-trench grooves for the parallel via-trench conductive lines using etching, wherein forming the parallel via-trench grooves comprises allowing the parallel via-trench grooves to merge during etching.

26. The method defined in claim 22 further comprising using a copper dual-damascene fabrication process to form the metal-layer conductive lines and the via-trench conductive line.

\* \* \* \* \*